United States Patent
Ahn

(10) Patent No.: US 12,237,295 B2
(45) Date of Patent: Feb. 25, 2025

(54) FLIP CHIP LASER BONDING SYSTEM

(71) Applicant: PROTEC CO., LTD., Gyeonggi-do (KR)

(72) Inventor: Geunsik Ahn, Seoul (KR)

(73) Assignee: PROTEC CO., LTD., Gyeonggi-do (KR)

( * ) Notice: Subject to any disclaimer, the term of this patent is extended or adjusted under 35 U.S.C. 154(b) by 880 days.

(21) Appl. No.: 17/365,995

(22) Filed: Jul. 1, 2021

(65) Prior Publication Data

US 2021/0335749 A1 Oct. 28, 2021

Related U.S. Application Data

(63) Continuation of application No. PCT/KR2019/006786, filed on Jun. 5, 2019.

(30) Foreign Application Priority Data

Jan. 4, 2019 (KR) .................. 10-2019-0001170

(51) Int. Cl.
*H01L 23/00* (2006.01)

(52) U.S. Cl.
CPC .............. *H01L 24/75* (2013.01); *H01L 24/81* (2013.01); *H01L 2224/75263* (2013.01); *H01L 2224/81224* (2013.01); *H01L 2224/81801* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 9,355,931 B2 | 5/2016 | Kim et al. | |
| 10,008,393 B2 | 6/2018 | Kim et al. | |
| 10,497,665 B2 | 12/2019 | Ahn | |
| 2009/0071945 A1* | 3/2009 | Terada | B23K 26/0665 219/121.63 |
| 2009/0229745 A1* | 9/2009 | Lee | B23K 26/0661 156/272.8 |
| 2013/0248114 A1* | 9/2013 | Seok | H01L 24/81 156/382 |

FOREIGN PATENT DOCUMENTS

| | | |
|---|---|---|
| JP | 2009253252 | 10/2009 |
| JP | 2009253252 A * | 10/2009 |
| JP | 5401709 | 1/2014 |
| KR | 20070028690 | 3/2007 |

(Continued)

OTHER PUBLICATIONS

Translation of JP-2009253252-A (Year: 2009).*

(Continued)

*Primary Examiner* — Elizabeth M Kerr
(74) *Attorney, Agent, or Firm* — JCIPRNET

(57) ABSTRACT

Provided is a flip-chip laser bonding system for bonding a semiconductor chip in the form of a flip chip to a substrate using a laser beam. In the flip-chip laser bonding system, the semiconductor chip is laser-bonded to the substrate while pressure is applied to the semiconductor chip. Accordingly, even a semiconductor chip that is bent or is capable of being bent can be bonded to a semiconductor chip without contact failure.

7 Claims, 5 Drawing Sheets

(56) References Cited

FOREIGN PATENT DOCUMENTS

| KR | 101297372 | 8/2013 |
| KR | 20150088371 | 8/2015 |
| KR | 20170140477 | 12/2017 |
| KR | 20170140477 A * | 12/2017 |
| KR | 20180137887 | 12/2018 |

OTHER PUBLICATIONS

Translation of KR-20170140477-A (Year: 2017).*
"International Search Report (Form PCT/ISA/210) of PCT/KR2019/006786," mailed on Sep. 27, 2019, with English translation thereof, pp. 1-4.

* cited by examiner

FLIP CHIP LASER BONDING SYSTEM

CROSS REFERENCE TO RELATED APPLICATION

This is a continuation of International Application No. PCT/KR2019/006786 filed on Jun. 5, 2019, and claims priority from Korean Patent Application No. 10-2019-0001170 filed on Jan. 4, 2019, the entire disclosures of which are incorporated herein by reference.

TECHNICAL FIELD

The present disclosure relates to a flip-chip laser bonding system, and more particularly, to a flip-chip laser bonding system in which a semiconductor chip in the form of a flip chip is bonded to a substrate by using a laser beam.

BACKGROUND ART

As electronic products are miniaturized, flip-chip type semiconductor chips in which wire bonding is not used, are widely used. A semiconductor chip in the form of a flip chip is mounted on a substrate in such a way that a plurality of electrodes in the shape of solder bumps are formed on a lower surface of the semiconductor chip and bonded at corresponding locations of solder bumps formed on the substrate.

As a method for mounting a semiconductor chip on a substrate by the flip-chip method, there are a reflow method and a laser bonding method. In the reflow method, in a state in which a semiconductor chip having a solder bump coated with a flux thereon is placed on a substrate, the semiconductor chip is allowed to pass through a high-temperature reflow, thereby bonding the semiconductor chip on the substrate. Like in the reflow method, in the laser bonding method, in a state in which a semiconductor chip having a solder bump coated with a flux thereon is placed on a substrate, the semiconductor chip is irradiated with a laser beam to transmit energy, so that the solder bump melts and hardens instantaneously, and thus the semiconductor chip is bonded to the substrate.

A semiconductor chip in the form of a flip chip which has been used in recent years is becoming thinner by several tens of micrometers or less. In the case where the semiconductor chip is thin as described above, the internal stress of the semiconductor chip itself often causes the same to be slightly bent or warped. When the semiconductor chip is deformed in this way, some solder bumps of the semiconductor chip may be bonded without being in contact with corresponding solder bumps of the substrate. This situation results in a failure of the semiconductor chip bonding process. In addition, when the temperatures of the semiconductor chip and the substrate are raised in order to bond the semiconductor chip to the substrate, the semiconductor chip or the substrate may be partially bent or warped due to a difference in thermal expansion coefficient of materials. This phenomenon also causes a failure of the semiconductor chip bonding process.

DESCRIPTION OF EMBODIMENTS

Technical Problem

The present disclosure has been made to solve the above-described problems, and an objective of the present disclosure is to provide a flip-chip laser bonding system in which a bent or warped semiconductor chip or a semiconductor chip that is capable of being bent or warped by an increase in temperature, is effectively bonded to the substrate while contact-failure of solder bumps is prevented.

Solution to Problem

One or more embodiments include a flip-chip laser bonding system including: a supply unit configured to supply a substrate on which a plurality of semiconductor chips, which are to be bonded to a an upper surface of the substrate, are disposed; a fixing unit configured to receive the substrate from the supply unit and fix a lower surface of the substrate; a laser unit including a laser head for irradiating the substrate fixed on the fixing unit with a laser beam to bond the semiconductor chips to the substrate and a laser transport unit for transporting the laser head; a mask having a plurality of transmission portions that transmit a laser beam irradiated from the laser head of the laser unit; a mask mounting unit configured to mount the mask above the fixing unit; a discharge unit configured to receive the substrate from the fixing unit and discharge the substrate; and a control unit configured to control the operations of the supply unit, the fixing unit, the laser unit, and the discharge unit.

Advantageous Effects of Disclosure

In a flip-chip laser bonding system according to the present disclosure, a semiconductor chip is laser-bonded to a substrate while pressure is applied to the semiconductor chip. Accordingly, even a semiconductor chip that is bent or is capable of being bent can be bonded to a semiconductor chip without contact failure.

MODE OF DISCLOSURE

A flip-chip laser bonding system according to the present disclosure will now be described in detail with reference to the accompanying drawings.

Figure 1:
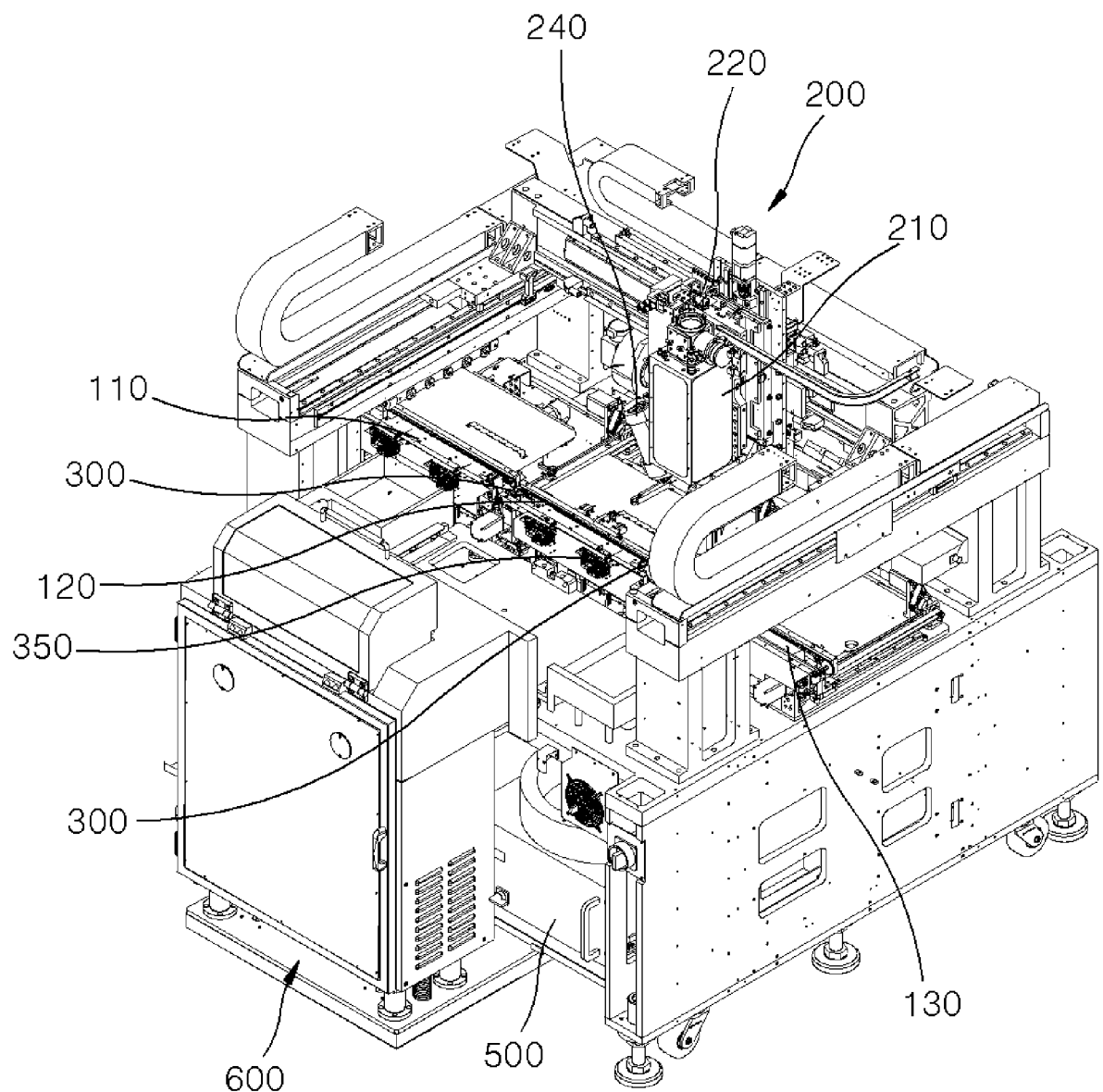
FIG. 1 is a perspective view of a flip-chip laser bonding system according to an embodiment of the present disclosure.
Figure 2:
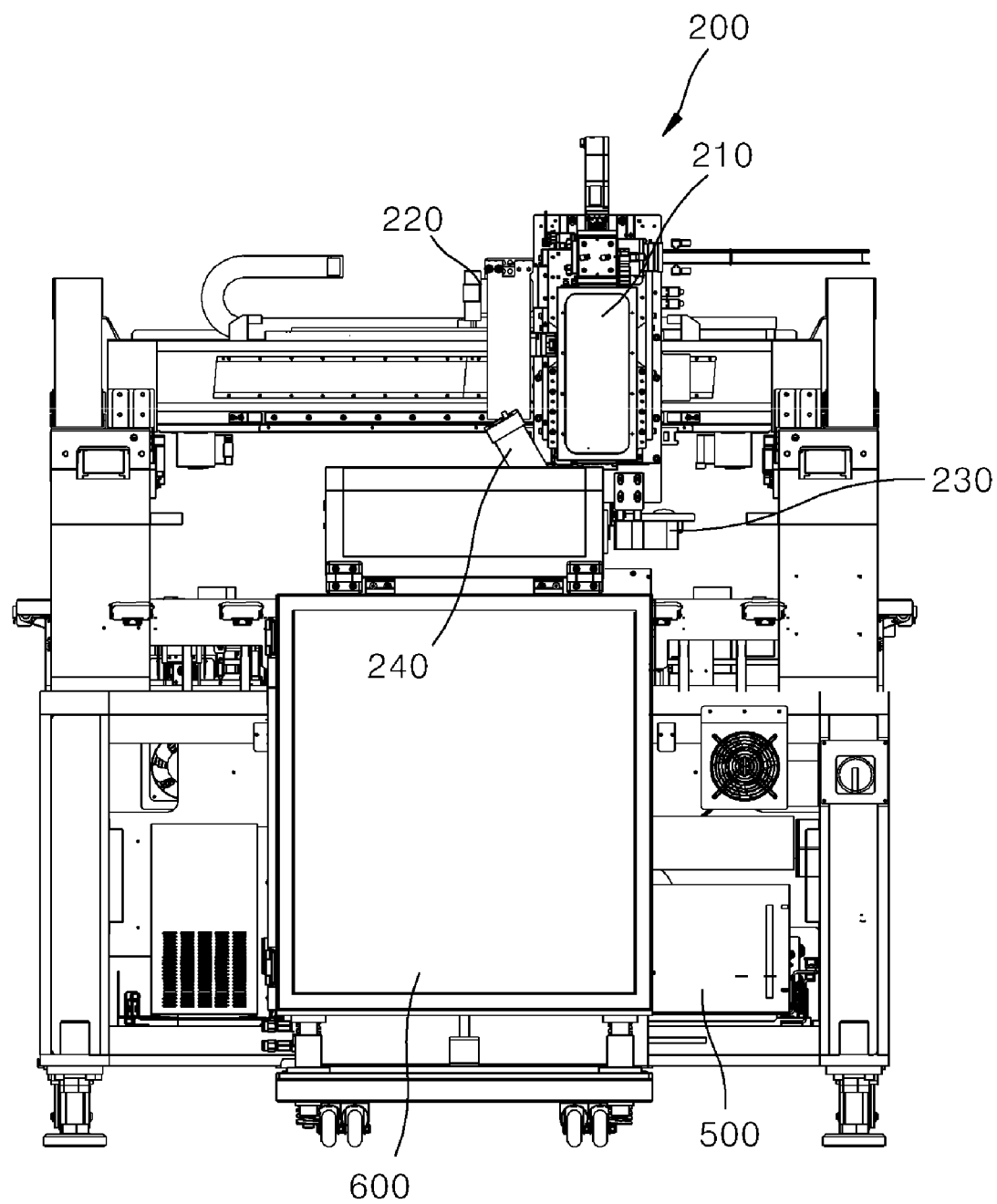
FIG. 2 is a front view of the flip-chip laser bonding system illustrated in FIG. 1.

FIG. 1 is a perspective view of a flip-chip laser bonding system according to an embodiment of the present disclosure, and FIG. 2 is a front view of the flip-chip laser bonding system illustrated in FIG. 1.

A flip-chip laser bonding system of the present embodiment is an apparatus for bonding a semiconductor chip to a substrate in a flip-chip form by using a laser beam. Solder bumps are formed on one or both of the substrate and the semiconductor chip. Accordingly, the solder bumps are instantaneously melted and solidified by the energy transmitted by the laser beam, thereby bonding the semiconductor chips on the substrate.

Referring to FIGS. 1 and 2, the flip-chip laser bonding system according to the present embodiment includes a supply unit 110, a fixing unit 120, a laser unit 200, and a discharge unit 130.

The supply unit 110 is configured to supply, to the fixing unit 120, a substrate for laser bonding. The substrate is supplied with a plurality of semiconductor chips arranged thereon. Typically, a flux is applied to the substrate and semiconductor chips are placed thereon. Due to the viscosity or adhesiveness of the flux, the semiconductor chips are temporarily bonded to the substrate. As long as relatively large vibrations or external forces are not applied, the semiconductor chips placed on the substrate are kept in position relative to the substrate by flux without being shaken.

The supply unit 110 may sequentially supply, to the fixing unit 120, a plurality of substrates, each having the semiconductor chips temporarily bonded thereto. In the present embodiment, the supply unit 110 may supply the substrate to the fixing unit 120 by using belts that support opposite sides of the substrate.

The fixing unit 120 may also transfer, to the working position, the substrate transported from the supply unit 110 by using belts supporting opposite sides of the substrate. The fixing unit 120 may fix the substrate by adsorbing the lower surface thereof.

The laser unit 200 may be arranged above the fixing unit 120. The laser unit 200 may include a laser head 210 and a laser transport unit 220. The laser head 210 radiates a laser beam onto a substrate fixed on the fixing unit 120 to transfer energy. The laser transport unit 220 moves the laser head 210 in the vertical direction and the horizontal direction. A control unit 500 operates the laser unit 200 in such a way that the laser head 210 radiates a laser beam while sequentially moving above the semiconductor chip of the substrate fixed on the fixing unit 120.

A mask 400 may be arranged above the fixing unit 120 on which the substrate is fixed. The mask 400 may be supported by a mask mounting unit 300. The mask 400 may have transmission portions 440 capable of transmitting laser light. The laser beam irradiated from the laser head 210 reaches the semiconductor chip located thereunder through the transmission portions 440 of the mask 400. A specific structure of the mask 400 will be described later.

A pressing unit 350 is configured to raise or lower one of the mask mounting unit 300 and the fixing unit 120 with respect to the other so as to press the semiconductor chip attached to the substrate by the transmission portions 440 of the mask 400. In the present embodiment, the pressing unit 350 may raise or lower the substrate. Referring to FIG. 2, the pressing unit 350 may raise or lower a configuration of the fixing unit 120 that adsorbs the lower surface of the substrate. When the pressing unit 350 lifts up the substrate in a state in which the mask 400 is mounted on the mask mounting unit 300, the weight of the transmission portions 440 of the mask 400 may affect and press the semiconductor chip.

The discharge unit 130 may receive the substrate on which the laser bonding of the semiconductor chip has been completed in the fixing unit 120 and discharge the same. Like the supply unit 110 and the fixing unit 120, the discharge unit 130 may receive the substrate from the fixing unit 120 by using belts supporting opposite sides of the substrate and discharge the substrate to an unloader.

The control unit 500 may control the operation of the main components of the present disclosure, including the supply unit 110, the fixing unit 120, the laser unit 200, the discharge unit 130, and the like.

An inspection camera 230 may be arranged above the fixing unit 120. In the present embodiment, the inspection camera 230 is provided on the laser unit 200 and is moved together with the laser head 210 by the laser transport unit 220. The inspection camera 230 may capture images of the substrate or the mask 400 disposed thereunder so as to allow the control unit 500 to identify the location of the semiconductor chip or to determine whether the mask 400 is contaminated.

An inspection lamp 610 may be arranged under the inspection camera 230. In the present embodiment, the inspection lamp 610 may be provided in a mask replacement unit 600, which will be described later. The inspection lamp 610 may be disposed under the path along which the mask 400 is transported. The inspection lamp 610 radiates light from under the mask 400. The light generated by the inspection lamp 610 may be transmitted to the inspection camera 230 disposed thereabove through the transmission portions 440 of the mask 400. By using the illumination of the inspection lamp 610, the inspection camera 230 may effectively capture the image of the transmission portions 440 of the mask 400. Once the control unit 500 receives the image captured by the inspection camera 230, the control unit 500 inspects whether the transmission portions 440 of the mask 400 are contaminated, and based on this result, the control unit 500 may determine whether the mask 400 needs to be replaced.

Figure 3:
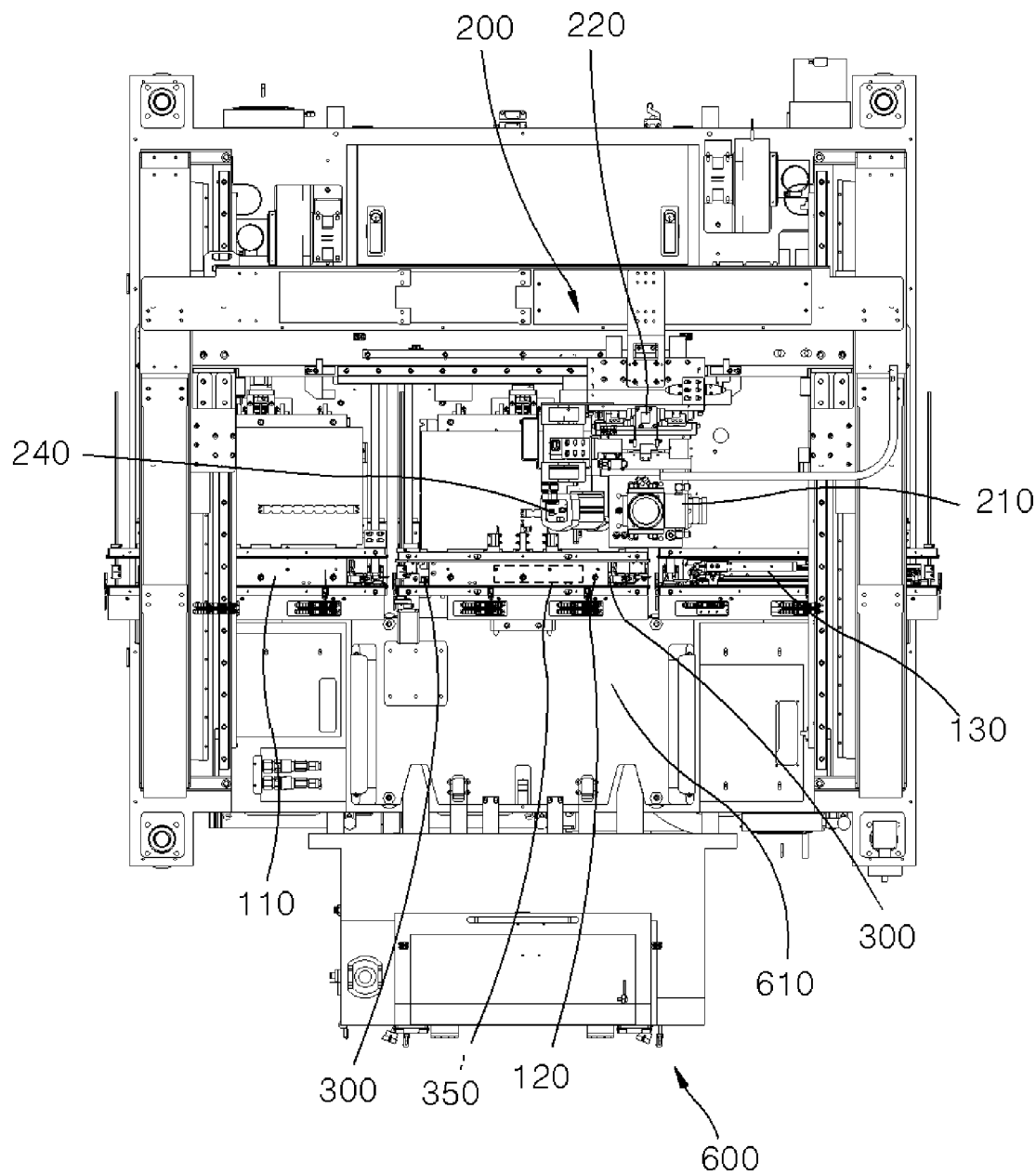
FIG. 3 is a plan view of a part of the flip-chip laser bonding system illustrated in FIG. 1.

Referring to FIG. 3, an infrared camera 240 is provided above the fixing unit 120. The infrared camera 240 captures the image of the semiconductor chip of the substrate fixed on the fixing unit 120. When the mask 400 is disposed above the substrate, the image of the semiconductor chip may be captured through the transmission portions 440 of the mask 400. The control unit 500 may identify the region-by-region temperature of the semiconductor chip by using values obtained from the image captured by the infrared camera 240. The control unit 500 may control the operation of the laser head 210 in the laser unit 200 by using the measurement values of the infrared camera 240.

The mask replacement unit 600 is configured to store a plurality of masks and, if needed, to replace the mask 400 mounted on the mask mounting unit 300. If needed, the control unit 500 may send a command for replacing the mask 400 to the mask replacement unit 600, and the mask replacement unit 600 may replace the mask 400 mounted on the mask mounting unit 300 with a new mask. As described above, since the inspection lamp 610 is provided in the mask replacement unit 600, the contamination test may be performed while the mask 400 to be replaced is arranged above the inspection lamp 610. Once it is determined by the control unit 500 based on the image taken by the inspection camera 230 that the contamination has not occurred, the mask 400 is transported back to the mask mounting unit 300. When the control unit 500 determines that the mask 400 has been contaminated, the contaminated mask 400 may be stored in the mask replacement unit 600 and a new mask is extracted and transported to the mask mounting unit 300.

Figure 4:
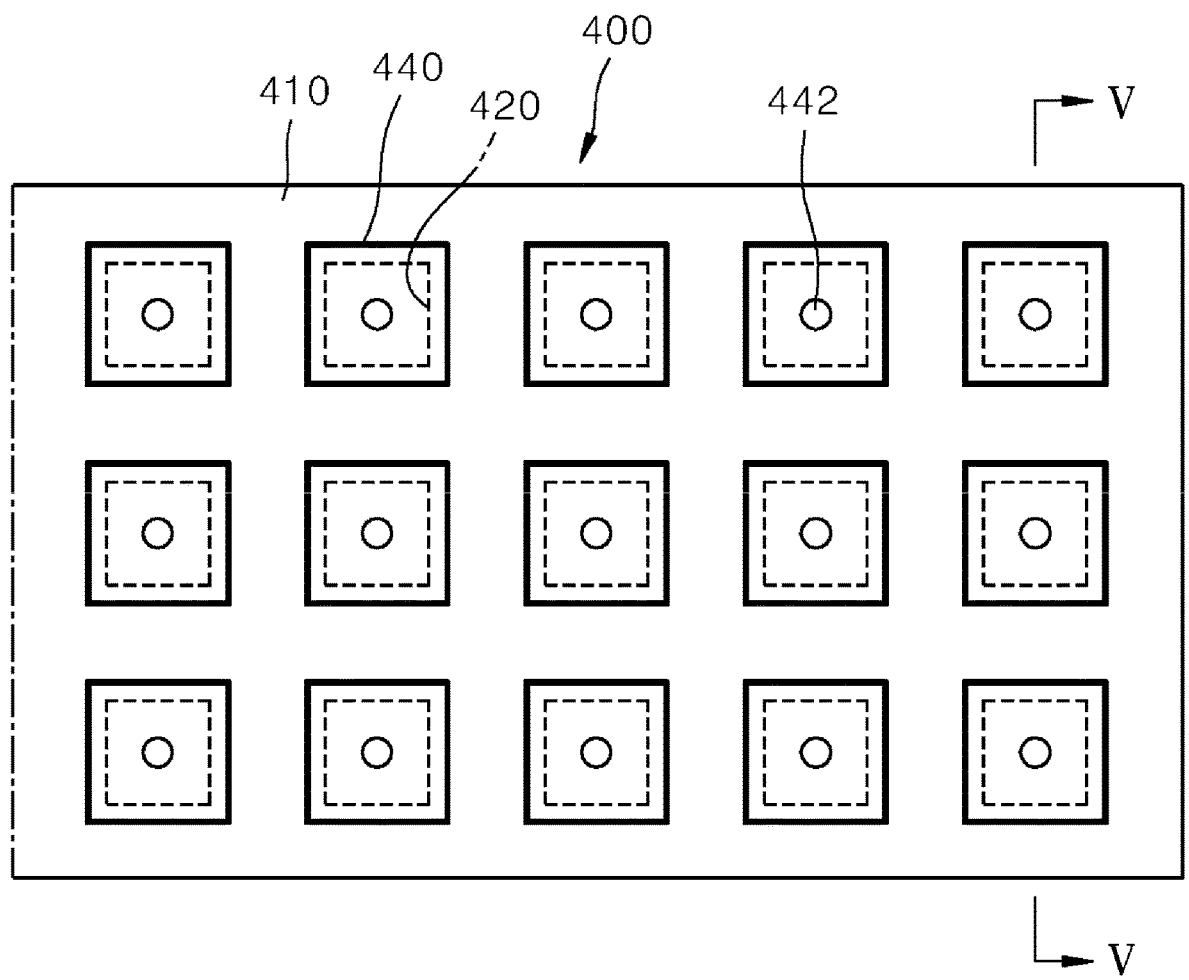
FIG. 4 is a plan view of a mask used in the flip-chip laser bonding system illustrated in FIG. 1.

Hereinafter, the structure of the mask 400 will be described with reference to FIGS. 4 and 5.

In the present embodiment, the mask 400 includes a mask body 410, a plurality of transmission holes 420, and a plurality of transmission portions 440.

The mask body 410 may formed in a flat-plate shape. The mask body 410 may be prepared into a shape corresponding to the shape of the substrate and is prepared to a size similar to that of the substrate in consideration of the size of the substrate.

The mask body 410 may have the plurality of transmission holes 420. The transmission holes 420 are respectively formed at positions corresponding to the positions of the semiconductor chips of the substrate to be placed under the mask 400. The transmission holes 420 may be formed in a size and shape similar to those of the semiconductor chip. In the present embodiment, the transmission holes 420 of the mask body 410 may be slightly larger than the sizes of the semiconductor chips.

Each of the transmission holes 420 is provided with a locking protrusion 430 formed to protrude inward. In the present embodiment, as illustrated in FIG. 4, the locking protrusion 430 is formed in a shape corresponding to the transmission holes 420. As for the shape of the locking protrusion 430, various other shapes other than the shape illustrated in FIG. 4 may be used.

Figure 5:
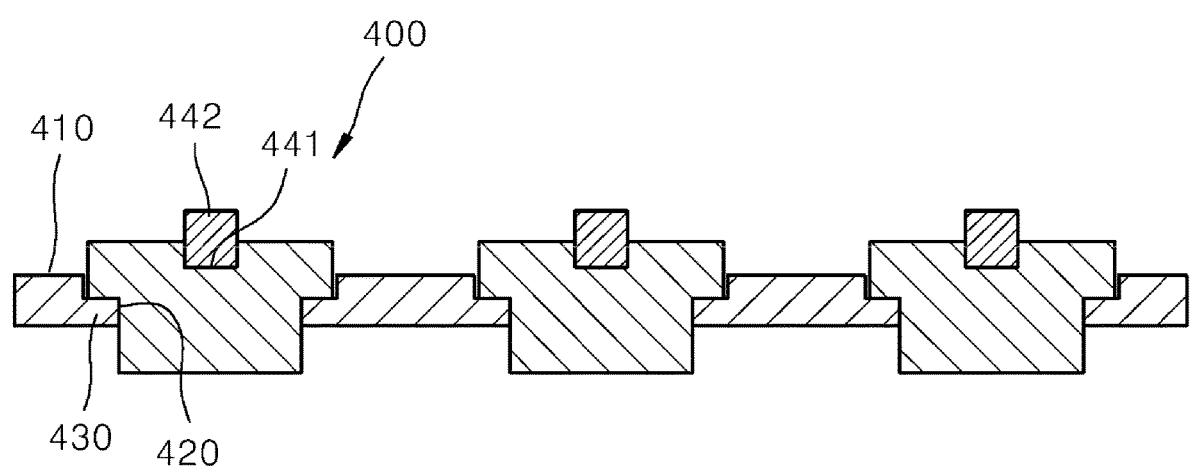
FIG. 5 is a cross-sectional view taken along line V-V of the mask illustrated in FIG. 4.

Referring to FIG. 5, the transmission portions 440 may be inserted into the transmission holes 420, one by one. At this time, the lower portion of each of the transmission portions 440 is formed to be caught by the locking protrusion 430. A lower surface of each of the transmission portions 440 may be formed in a planar shape. When the transmission portions 440 respectively press the semiconductor chips on the substrate by the operation of the pressing unit 350, the semiconductor chips may be uniformly and flatly pressed by the transmission portions 440, each having a flat lower surface. The transmission portions 440 may include a transparent material through which a laser beam may pass. Quartz, widely used for transmitting a laser beam, may be used as a material for the transmission portions 440. The mask body 410 may include an opaque material through which the laser beam does not pass. The mask body 410 may prevent the laser beam from passing through the region except for the transmission portions 440.

In the present embodiment, a weight indentation 441 may be formed on the upper surface of each of the transmission portions 440. A weight 442 may be disposed in the weight indentation 441. The weight 442 may further increase the force applied by the transmission portions 440 to press the semiconductor chip.

Hereinafter, the operation of the flip-chip laser bonding system according to the present embodiment configured as described above will be described.

First, a substrate on which semiconductor chips are arranged is prepared. As described above, the supply unit 110 may sequentially supply substrates with semiconductor chips arranged thereon in such a manner that the semiconductor chips having solder bumps applied with flux thereunder are temporarily bonded to the substrate.

The supply unit 110 supplies the substrate to the fixing unit 120. The fixing unit 120 receives the substrate and fixes the same by adsorbing the lower surface thereof.

In this state, the laser transport unit 220 of the laser unit 200 captures the images of the semiconductor chips of the substrate by moving the inspection camera 230 over the substrate. The control unit 500 identifies the positions of the semiconductor chips by using the images received from the inspection camera 230.

Next, the mask replacement unit 600 may transport the mask 400 to the upper side of the fixing unit 120. The mask mounting unit 300 receives the mask 400 and mounts the same on the upper side of the substrate.

In this state, the pressing unit 350 may raise the substrate fixed on the fixing unit 120.

When the substrate is raised by the pressing unit 350, the semiconductor chips of the substrate come into contact with the lower surface of the transmission portions 440 of the mask 400, respectively. As the pressing unit 350 continues to raise the substrate, each of the semiconductor chips lifts the transmission portions 440 against the mask body 410. As described above, since the transmission portions 440 are caught by the locking protrusion 430 of the mask body 410, in the case where the semiconductor chips are continuously raised, the transmission portions 440 may be lifted upward by the semiconductor chips. That is, in the stat that the mask body 410 is in a stationary state, only the transmission portions 440 are raised. As a result, the weight of the transmission portions 440 affects each semiconductor chip to flatly press the upper surface of the semiconductor chips. At this time, when the weight 442 is disposed in the weight indentation 441 of the transmission portions 440 as described above, the magnitude of the force pressing the semiconductor chips is increased as high as the weight of the weight 442.

In this state, the control unit 500 operates the laser unit 200 to sequentially bond the semiconductor chips of the substrate. The laser transport unit 220 sequentially places the laser head 210 on each of the semiconductor chips, and when the laser head 210 radiates a laser beam thereto, the semiconductor chips are bonded to the substrate. When the laser beam passes through the transmission portions 440 and the body of the semiconductor chips and is delivered to the solder bumps, the temperature thereof is raised so that the solder bumps are adsorbed to the pad of the substrate.

Since the laser beam instantaneously increases the temperature of the solder bumps, the temperature of the semiconductor chips is not raised beyond an appropriate level. Even when the semiconductor chip is warped or subjected to thermal deformation, since the transmission portions 440 of the mask 400 press the upper surface of the semiconductor chip, the semiconductor chip may be prevented from being warped or bent. When the semiconductor chip is prevented from being bent in this manner, the defect in which some of the solder bumps of the semiconductor chip are not bonded to the substrate, may be prevented.

As described above, since the laser beam may only pass through the transmission portions 440 of the mask 400 and may not pass through the mask body 410, the laser beam irradiated from the laser head 210 is transmitted only to the semiconductor chips. In this way, by using the mask 400 having the transmission portions 440 and the mask body 410, the irradiation of the laser beam to the portion of the substrate that does not need to receive the energy of the laser beam, may be prevented.

Also, it is possible to simultaneously bond a plurality of semiconductor chips to the substrate. When the laser head 210 is operated to widen the irradiation area of the laser beam, two or more semiconductor chips may be simultaneously irradiated with the laser beam. Since the laser beam may not pass through the mask body 410 of the mask 400, even in the case where the laser beam is irradiated to a wide area, it is possible to transmit the energy of the laser beam only to the semiconductor chip that needs bonding. By bonding a plurality of semiconductor chips to the substrate at the same time in this manner, the productivity of the overall processes may be improved. In some cases, the mask 400 may be entirely irradiated with a laser beam so as to bond all of the semiconductor chip to the substrate at the same time.

Meanwhile, the region in which the weight indentation 441 and the weight 442 of the transmission portions 440 are disposed, may be formed in a region in which the solder bumps of the semiconductor chip are not formed. In the present embodiment, since solder bumps are not present in the central portion of each of the semiconductor chips, but only in the edge portion of each of the semiconductor chips, the weight indentation 441 and the weight 442 are disposed in the central portion of each of the transmission portions 440 as illustrated in the corresponding drawing.

The substrate, which has been completely bonded through the process as described above, is transported from the fixing unit 120 to the discharge unit 130. The discharge unit 130 receives the substrate and transports the same to the unloader.

The control unit 500 may operate the mask replacement unit 600 to perform a contamination test or replace, when the number of times the mask 400 is used exceeds a certain level.

For example, after the mask 400 is used 20 times, the control unit 500 may controls such that the mask 400 is transported from the mask mounting unit 300 to the upper side of the inspection lamp 610 by the mask replacement unit 600. In this state, the control unit 500 turns on the inspection lamp 610, and the inspection camera 230 captures the image of the mask 400. When dust particles are found in the image of the mask 400 indicating that the transmission portions 440 are contaminated, the control unit 500 operates the mask replacement unit 600 to replace the mask 400. The mask replacement unit 600 replaces the contaminated mask and transports a new mask to the mask mounting unit 300 and mounts the same thereon. When it is determined that the mask 400 is not contaminated as a result of the inspection by the control unit 500, the mask 400, which is on the upper side of the inspection lamp 610, is transported to the mask mounting unit 300 again and reused.

On the other hand, the control unit 500 may measure the temperature of the semiconductor chips in real time using the infrared camera 240 and control the operation of the laser head 210 based on the temperature measurements. In the case where the mask 400 is used, the infrared camera 240 measures the temperature of the semiconductor chips indirectly through the temperature of the mask 400.

The flip-chip laser bonding system of the present embodiment may not use the mask 400 in some cases. In the case where there is no possibility that the semiconductor chip placed on the substrate is bent or warped, the semiconductor chip may be irradiated directly with the laser beam without pressing the semiconductor chips by using the mask 400. In this case, the image of the upper surface of the semiconductor chips is directly captured by using the infrared camera 240, and based on the measurements, the control unit 500 may feedback-control the operation of the laser head 210.

Although preferred examples have been described above for present disclosure, the scope of present disclosure is not limited to the embodiments described and illustrated above.

For example, although it has been described above that the pressing member raises the substrate, it is also possible for the pressing member to lower the mask 400 by pressing the semiconductor chips.

In addition, although it has been described that, in the transmission portions 440 of the mask 400, the weight indentation 441 is formed and the weight 442 is disposed. However, in some embodiments, the mask 400 may not have the weight indentation 441 and the weight 442.

In addition, although in the previous embodiments, a flip-chip laser bonding system including a mask replacement unit 600 has been described, in other embodiments, a flip-chip laser bonding system that does not include the mask replacement unit 600 may be used. In this case, the mask 400 may be continuously used without the inspection test to identify whether the mask 400 has been contaminated. In some embodiments the flip-chip laser bonding system may be configured such that the mask 400 is manually replaced.

In some embodiment, the flip-chip laser bonding system may be configured such that the infrared camera 240, the inspection lamp 610, the inspection camera 230, and the like are not included.

The invention claimed is:

1. A flip-chip laser bonding system, comprising:
   a supply unit comprising belts that support opposite sides of a substrate configured to supply the substrate on which a plurality of semiconductor chips, which are to be bonded to an upper surface of the substrate, are disposed;
   a fixing unit comprising a substrate holder configured to receive the substrate from the supply unit and fix a lower surface of the substrate;
   a laser unit including
      a laser head for irradiating the substrate fixed on the fixing unit with a laser beam to bond the semiconductor chips to the substrate, and
      a laser transport unit comprising a laser head holder, and a moving rail for transporting the laser head;
   a mask having a plurality of transmission portions that transmit a laser beam radiated from the laser head of the laser unit;
   a mask mounting unit comprising a mask holder for supporting the mask is configured to mount the mask above the fixing unit;
   a discharge unit configured to receive the substrate from the fixing unit and discharge the substrate;
   a controller configured to control the operations of the supply unit, the fixing unit, the laser unit, and the discharge unit; and
   a pressing unit comprising a stage for placing the substrate configured to raise or lower one of the mask mounting unit and the fixing unit with respect to the other so that the plurality of transmission portions of the mask presses the plurality of semiconductor chips of the substrate fixed on the fixing unit,
   wherein the mask further includes a mask body having a flat plate shape, and a plurality of transmission holes formed in the mask body, and the plurality of transmission portions are to be inserted into the plurality of transmission holes of the mask, respectively.

2. The flip-chip laser bonding system of claim 1, further comprising:
   a mask replacement unit comprising a mask storing compartment configured to supply the mask to the mask mounting unit or to discharge the mask.

3. The flip-chip laser bonding system of claim 2, further comprising:
   an inspection lamp disposed under the mask and configured to irradiate the mask with light; and
   an inspection camera disposed above the mask or the substrate and configured to capture the image of the mask or the substrate, wherein
   the control unit determines whether the mask is contaminated by using the image of the mask captured by the inspection camera.

4. The flip-chip laser bonding system of claim 3, wherein the inspection lamp is provided in a mask replacement unit, and the inspection camera is provided in the laser unit and transported by the laser transport unit.

5. The flip-chip laser bonding system of claim 4, further comprising:
an infrared camera configured to capture the image of the semiconductor chips irradiated with the laser beam by the laser head of the laser unit, wherein
the control unit is configured to control the operation of the laser head by using a value measured by the infrared camera.

6. The flip-chip laser bonding system of claim 1, wherein the mask further includes a locking protrusion protruding inward in each of the plurality of transmission holes, and
the plurality of transmission portions are mounted in such a manner that the plurality of transmission portions are respectively inserted into the plurality of transmission holes of the mask and are caught by the locking protrusion.

7. The flip-chip laser bonding system of claim 6, wherein a weight indentation is formed recessed in each of the plurality of transmission portions of the mask, and
the mask further includes a weight mounted in a weight indentation of the transmission portion so as to increase a weight applied to each of the plurality of semiconductor chips disposed on the substrate.

\* \* \* \* \*